United States Patent
Fujii et al.

(10) Patent No.: US 6,379,193 B1
(45) Date of Patent: Apr. 30, 2002

(54) SUBSTRATE CONNECTOR ASSEMBLY FOR A COMPUTER SYSTEM

(75) Inventors: Kazuo Fujii, Yokohama; Hidenori Kinoshita, Machida, both of (JP); Thomas Studwell, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/303,736

(22) Filed: May 3, 1999

(30) Foreign Application Priority Data

Aug. 19, 1998 (JP) .............................................. 10-232697

(51) Int. Cl.7 ............................................... H01R 13/64
(52) U.S. Cl. ....................................... 439/680; 439/633
(58) Field of Search ................................ 439/633, 680, 439/951, 924.1, 637, 325, 59; 174/260; 361/785

(56) References Cited

U.S. PATENT DOCUMENTS

| | | | | |
|---|---|---|---|---|
| 4,602,842 A | * | 7/1986 | Free et al. | 439/680 |
| 4,695,112 A | * | 9/1987 | Maston et al. | 439/680 |
| 4,781,626 A | * | 11/1988 | Lazarchik | 439/680 |
| 5,387,132 A | * | 2/1995 | Sarver et al. | 439/633 |
| 5,468,920 A | * | 11/1995 | August | 439/951 |
| 5,692,910 A | * | 12/1997 | Mittal | 439/924.1 |
| 5,709,555 A | * | 1/1998 | Noschese | 439/924.1 |

FOREIGN PATENT DOCUMENTS

| | | |
|---|---|---|
| JP | 54-117893 | 1/1953 |
| JP | 3-32376 | 3/1991 |

* cited by examiner

*Primary Examiner*—Tulsidas Patel
(74) *Attorney, Agent, or Firm*—Andrew Dillon

(57) ABSTRACT

Described is a substrate connector assembly which includes a first circuit substrate, a second circuit substrate and a connector mounted on the first circuit substrate for connecting wiring patterns formed on the first circuit substrate with wiring patterns formed on the second circuit substrate. The first circuit substrate includes first wiring patterns capable of being connected to external wirings and second wiring patterns in a second wiring area apart from the first wiring patterns by a predetermined creepage distance to provide a sufficient isolation. The connector includes a contact array of a plurality of contacts, and a key which is formed at a position for separating the plurality of contacts of the contact array into a first contact group and a second contact group for (1) preventing a misconnection of the second circuit substrate and (2) separating the first wiring patterns from the second wiring patterns by the predetermined creepage distance. The first contact group is connected to the first wiring patterns and the second contact group is connected to the wiring patterns in the second wiring area.

4 Claims, 3 Drawing Sheets

SUBSTRATE CONNECTOR ASSEMBLY FOR A COMPUTER SYSTEM

BACKGROUND OF THE INVENTION

1. Field of the Invention

The present invention relates to a substrate connector assembly for connecting one circuit substrate which includes wiring patterns spaced from each other by a required creepage distance for providing an isolation between the wiring patterns, with another circuit substrate having wiring patterns spaced from each other by a required creepage distance and to a computer system which includes such a substrate connector assembly.

2. Description of Related Art

An analog public telephone line is used as a communication path for communicating information between two computers, and a modem is mounted within the computer which performs a bidirectional conversion from the analog signal to the digital signal and from the digital signal to the analog signal. A modem card is a subsystem of the computer, and various semiconductor chips, devices and wiring patterns for interconnecting them are mounted on the modem card. In a computer which includes the modem card, the modem card is connected to a connector on the mother board to stack the modem card on the mother board. A portion of the wiring patterns of the modem card are connected to a modular jack attached to the mother board, and the modular jack is connected to the public telephone line.

Since the public telephone line can transfer a lightning surge voltage, an insulating transformer for preventing the surge voltage from being transmitted to the circuit in the modem card is mounted on the modem card. To protect the wiring within the computer (hereinafter "secondary wiring") from the surge voltage on the wiring between the modular jack and the insulating transformer on the modem card (hereinafter "primary wiring"), which is transmitted from the public telephone line, it is necessary to maintain a predetermined dielectric strength between the primary wiring and the secondary wiring. As one method for maintaining the required dielectric strength, a cable is used as the primary wiring. In the case that both the primary wiring and secondary wiring are formed on the mother board or the modem card, it is necessary to provide a sufficient creepage distance between the primary wiring and the secondary wiring. The creepage distance is known as the shortest distance between two conductors measured along a surface of the insulator on which the two conductors are formed.

If the wiring patterns of the mother board are used as the primary wiring, and the connector is used to connect the modem card to the mother board, it is necessary to maintain a sufficient creepage distance between the primary wiring and the secondary wiring on the mother board and to maintain a sufficient creepage distance between contacts of the connector for the primary wiring patterns and the contacts of the connector for the secondary wiring patterns. Since a pitch between the contacts of the connector used in the modem card is too short to provide a sufficient creepage distance, the primary wiring cannot be connected to the secondary wiring through such a standard type connector. To solve the problem without using the connector, the primary wiring formed as the wiring patterns of the modem card are directly connected to the modular jack by the cable, and the connector is merely used to connect the secondary wiring patterns on the modem card and the secondary wiring patterns on the mother board. In this case, an extra step is required to connect the cable between the modem card and the modular jack after the connection of the modem card to the connector on the mother board, so that the free disconnection of the modem card from the mother board is limited after the connection of the cable, and it is difficult to make a space for the cable connection in a small type electronic apparatus, such as a notebook computer.

In the case that, without using the cable, one end of the primary wiring patterns on the mother board are connected to the modular jack, and the other end of the primary wiring patterns are connected to the primary wiring patterns formed on the modem card through the connector, some contacts of the connector between the contacts used for the primary wiring and the contacts used for the secondary wiring are removed to provide the required sufficient creepage distance between the primary wiring and the secondary wiring on the connector. In this case, the problem arises in that the extra step for removing the unused contacts is required, and a rate of usage of the connector is decreased by the number of removed contacts.

In some cases, a key notch is formed on the modem card to prevent a misconnection of the modem card into the connector, and a key for engaging into the key notch is formed in the connector.

OBJECTS OF THE INVENTION

Accordingly, one object of the present invention is to provide a substrate connector assembly which includes a circuit substrate formed with wiring patterns which should be separated from each other by the creepage distance to provide a sufficient isolation, and a connector connected to the wiring patterns. Another object of the present invention is to provide a substrate connector assembly using a connector which provides the required creepage distance to provide a sufficient isolation between the contacts used for the primary wirings and the contacts used for the secondary wirings by utilizing a mechanism for preventing the misconnection of the connector.

Another object of the present invention is to provide a computer system using such a substrate connector assembly.

SUMMARY OF THE INVENTION

The present invention is directed to a substrate connector assembly which includes a first circuit substrate, a second circuit substrate and a connector mounted on the first circuit substrate for connecting wiring patterns formed on the first circuit substrate with wiring patterns formed on the second circuit substrate. The circuit patterns formed on the first circuit substrate include first wiring patterns capable of being connected to external wiring and second wiring patterns apart from the first wiring patterns by a predetermined creepage distance. The external wiring means the wiring that would be subject to a surge voltage from an external atmosphere, and hence which should be separated from the second wiring patterns by a predetermined creepage distance to maintain a required dielectric strength. An example of the external wiring is the public telephone line.

Further, the connector includes a contact array of a plurality of contacts and a key which is formed at a position for separating the plurality of contacts of the contact array into a first contact group and a second contact group for (1) preventing a misconnection of the second circuit substrate and (2) separating the first contact group from the second contact group by the predetermined creepage distance. The first contact group is connected to the first wiring patterns and the second contact group is connected to the second wiring patterns. The key can have a structure which is engaged with the key notch formed on the second circuit substrate to prevent the misconnection of the second circuit substrate, and formed at a position for separating the contact array.

Any specific structure of the key is not required in the present invention if the above function is performed. In the present invention, the key can perform its original function, and the decrease of the number of the contacts is not required to form the key in the present invention. In addition, the key of the present invention provides the required creepage distance between the first contact group and the second contact group. The position of the key can be determined in accordance with the number of contacts included in the first contact group.

Another embodiment of the present invention is directed to a computer system which includes a mother board, a connector mounted on the mother board and a circuit substrate connected to the connector. The mother board includes wiring patterns capable of being connected to external wiring and internal wiring patterns for the computer. The wiring patterns capable of being connected to the external wiring, such as the public telephone line, are separated from the internal wiring patterns by the creepage distance to maintain the required dielectric strength.

Further, the connector includes a contact array of a plurality of contacts, and a key which is formed at a position for separating the plurality of contacts of the contact array into a first contact group and a second contact group for (1) preventing a misconnection of the circuit substrate and (2) separating the first contact group from the second contact group by a predetermined creepage distance. The first contact group is connected to the wiring patterns capable of being connected to the external circuit and the second contact group is connected to the internal wiring patterns.

Further, the circuit substrate includes a pad array of a plurality of pads, each of which is connected to each of the contacts of the contact array and a key notch capable of being engaged with the key of the connector, which is formed at a position for separating the plurality of pads of the pad array into a first pad group and a second pad group. The circuit substrate includes the modem card.

DETAILED DESCRIPTION OF THE INVENTION

Figure 1:
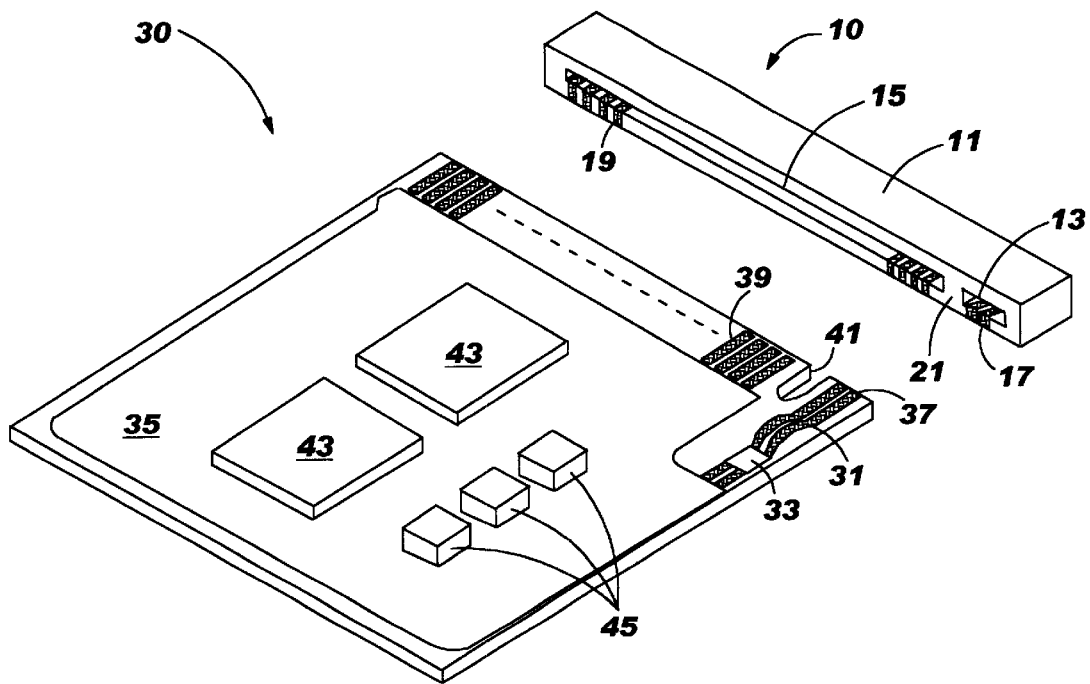
FIG. 1 shows a perspective view of a connector and modem card of the present invention.

FIG. 1 shows a perspective view of the connector 10 and the modem card 30 of the present invention. The connector 10 includes a connector body 11, card receiving portions 13 and 15 into which the modem card 30 is inserted, an array of a plurality of contacts 17 in the card receiving portion 13, an array of a plurality of contacts 19 in the card receiving portion 15, and a key 21. Although the array of contacts 17 and the array of contacts 19 formed on the lower surface of the card receiving portions 13 and 15, respectively are shown in FIG. 1, such arrays are also formed on the upper surface of the card receiving portions 13 and 15, respectively. A Dual Inline Memory Module (DIMM) type connector is used as the connector 10, and each of the contacts formed on the upper surface and the lower surface is electrically independent from each other. The array of contacts 17 includes two contacts on the upper surface and two contacts on the lower surface, and is capable of connecting to four circuits in total.

The key 21 is formed at a position apart from a center position which equally separates the contact body 11 into two halves, so that the key 21 functions to prevent the modem card with the upper and lower surfaces reversed from being inserted into the card receiving portions 13 and 15. The contacts 17 and 19 are formed to electrically connect to the modem card 30 inserted into the card receiving portions 13 and 15. To connect to the wiring patterns of the mother board later described, the contacts formed on the lower surface of the card receiving portions downwardly extend along the surface of the front edge of the contact body 11, as shown in FIG. 1, and the contacts formed on the upper surface (not shown) of the card receiving portions downwardly extend along the surface of the rear edge at the contact body.

The modem card 30 includes two primary wiring patterns 31 which can be connected to the public telephone line, an isolating transformer 33 connected to the primary wiring patterns, a secondary wiring area 35 connected to the isolating transformer 33, an array of pads 37 and an array of pads 39. The primary wiring patterns 31 are used as the two paths for the signals TIP and RING of the public telephone line. The secondary wiring pattern area 35 includes semiconductor chips 43 and devices 45 for realizing the function of the modem, and these are interconnected by the secondary wiring patterns. A key notch 41 of the structure for engaging with the key 21 of the connector 10 is formed between the array of pads 37 and the array of pads 39. Although only the upper surface of the modem card is shown in FIG. 1, the secondary wiring pattern, the semiconductor chips and the devices connected to the secondary wiring pattern are formed on the back surface of the modem card 30 as well.

The isolating transformer 33 transmits the analog signals from the primary wiring patterns 31 to the secondary wiring patterns 35, and prevents the surge voltage from being transmitted to the secondary wiring patterns. The creepage distance equal to or longer than 2.5 mm is established between the primary wiring patterns 31 and the secondary wiring patterns in the secondary wiring pattern area 35 to prevent the isolation between the primary wiring patterns and the secondary wiring patterns from being broken by the surge voltage. The two pads 37 are connected to the primary wiring patterns 31 and the plurality of pads 39 (only a portion of them is shown in the FIG. 1) are connected to the secondary wiring patterns of the secondary wiring pattern area 35. The key notch 41 cooperates with the key 21 to prevent the modem card with the upper and lower surfaces reversed from being misconnected to the connector 10.

When the modem card 30 is inserted into the card receiving portions 13 and 15 of the connector 10, the pads 37 electrically contact the corresponding contacts 17, and the pads 39 electrically contact the corresponding pads 19. The pads 37 and 39 formed on the surface of the modem card shown in FIG. 1 also contact the contacts formed on the upper surface of the card receiving portions 13 and 15. The key notch 41 engages with key 21 to complete the connection of the modem card 30 with the connector 10.

Figure 2:
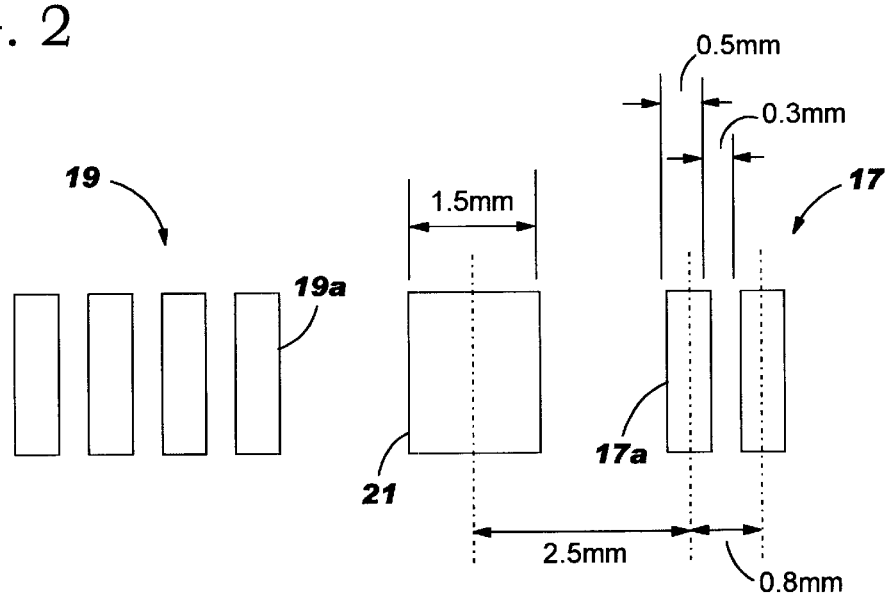
FIG. 2 shows the creepage distance around the key of the connector of FIG. 1.

FIG. 2 shows the dimensions of the contacts around the key 21 in the case that a connection structure of a Small Outline Dual Inline Memory Module (SODIMM) type conforming with the standard of the Joint Electron Device Engineering Council (JEDEC) is used in the connector 10 and the modem card 30. The key 21 is positioned between a nearest contact 17a to the contacts 19 among the contacts 17 used for connecting to the primary wiring patterns and a nearest contact 19a to the contact 17 among the contacts 19 used for connecting to the secondary wiring patterns. The International Electro Technical Commission (IEC) 950 standard requires that the creepage distance be equal to or greater than 2.5 mm between the contact 17a and the contact 19a. In the example shown in FIG. 2, this requirement is satisfied by the dimension of the key portion. The key is an essential part for the connector which prevents the misconnection of the card and is not used to improve the dielectric strength in the prior technology, but it is preferable in the present invention to form the key at the position which separates the contacts into the contact arrays in accordance with the number of the primary wirings.

Figure 3:
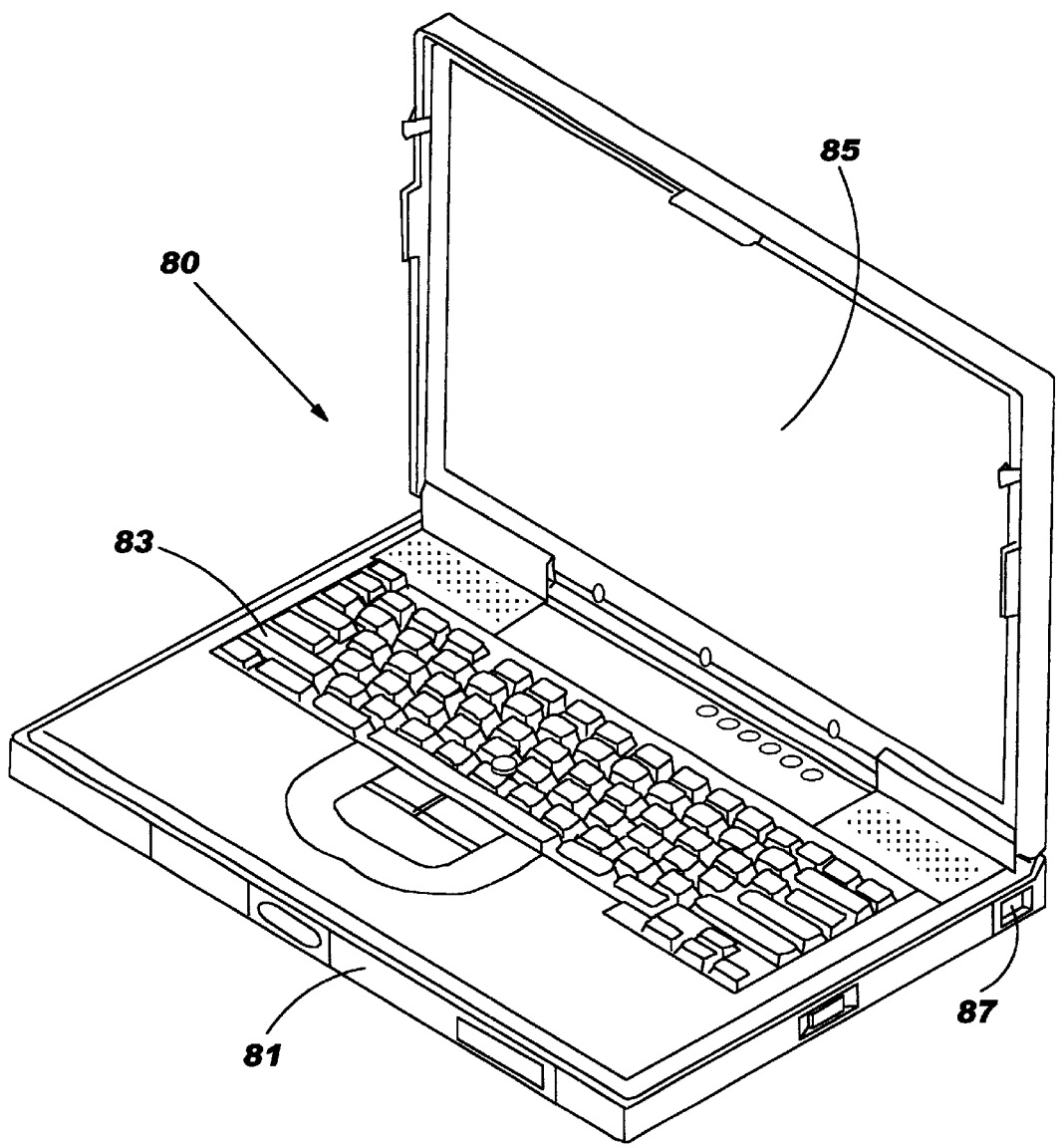
FIG. 3 shows a perspective view of a computer system using a substrate connector assembly in accordance with the present invention.

FIG. 3 shows an external view of a computer system 80 using a substrate connector assembly in accordance with the present invention. The computer system 80 includes a main body 81, a keyboard unit 83 mounted on the upper portion of the main body 81 and a liquid crystal display portion 85. The mother board mounting the modem card is mounted within the main body, and the substrate connector assembly of the present invention is used in the mother board. The modular jack 87 is mounted on the main body to provide an easy connection to the public telephone line on the surface of the main body.

Figure 4:
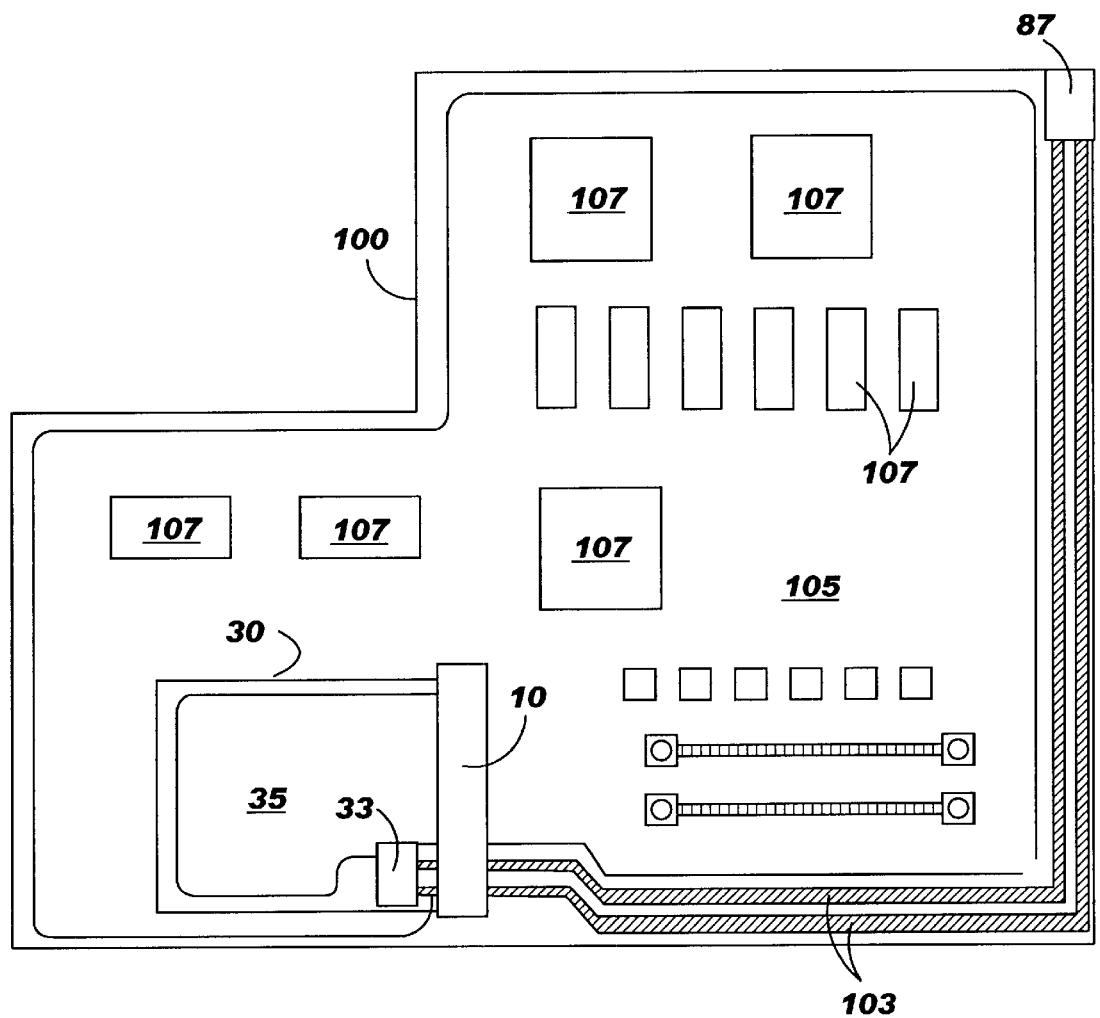
FIG. 4 shows a substrate connector assembly of the present invention which is used in the computer system of FIG. 3.

FIG. 4 shows a plan view of an embodiment of the present invention which is applied to the mother board of the computer system shown in FIG. 3. The modular jack 87 and the connector 10 described with reference to FIG. 1 are attached to the mother board 100 operating as the first circuit substrate. A plug of the public telephone line is connected to the modular jack 87. The modem card 30 i.e., second circuit substrate, described with reference to FIG. 1 is connected to the connector 10 to stack the card 30 on the mother board 100. The primary wiring patterns 103 i.e. first wiring patterns, for transmitting the TIP and RING signals and the secondary wiring area 105 are formed on the mother board 100. One end of the primary wiring patterns 103 is connected to the modular jack 87, and the other end of the primary wiring patterns 103 is connected to the contacts 17 of the connector 10. It is possible to provide a surge arrester, not shown, in the primary wiring patterns 103 to remove the surge voltage transmitted through the public telephone line. The secondary wiring area 105 includes semiconductor chips 107 of a CPU, a main memory, a video controller, an I/O controller, etc. and buses for interconnecting them. These elements are not described in detail since they are not an essential part of the present invention.

The creepage distance equal to or longer than 2.5 mm is provided between the primary wiring patterns 103 and the secondary wiring, i.e, second wiring patterns, patterns in the secondary wiring area 105. The primary wiring patterns 103 and the secondary wiring patterns in the secondary wiring area 105 on the mother board 100 are connected to the primary wiring patterns 31 and the secondary wiring patterns in the secondary wiring area 35 of the modem card 30, respectively through the connector 10. In the connector 10, a sufficient creepage distance between the contacts for the primary wiring and the contacts for the secondary wiring is provided by using the key 21 for preventing the misconnection. The present invention overcomes the above-mentioned disadvantages with the conventional technology by connecting the primary wiring patterns and the secondary wiring patterns formed on the mother board 100 to the primary wiring patterns and the secondary wiring patterns formed on the modem card 30 through the connector 10 in which the required creepage distance is met.

As apparent from the above description, the connector of the substrate connector assembly of the present invention can be used as a connector for connecting one circuit to the other circuit in which the provision of the required creepage distance between the primary wiring patterns and the secondary wiring patterns is required in addition to using the connector to connect the modem card to the mother board.

The present invention provides the substrate connector assembly which includes the substrate having the wiring patterns spaced from each other by the required creepage distance to provide the required isolation, and the connector connected to the wiring patterns. The present invention also provides the substrate connector assembly using the connector which provides the required creepage distance between the contacts by using the mechanism for preventing the misconnection of the connector. The present invention does not decrease the rate of usage of the contacts and does save the step of removing the contacts by forming the key for preventing the misconnection of the connector between the contacts for the primary wiring patterns and the contacts for the secondary wiring patterns. The present invention can utilize a portion of the wiring patterns of the mother board as the primary wiring patterns, and can connect the primary wiring patterns and the secondary wiring patterns of the circuit board to the primary wiring patterns and the secondary wiring patterns of the mother board by merely connecting the circuit board to the connector on the mother board without using the direct connection by the cable.

It should be noted that although the present invention was described with reference to a public telephone line as the external wiring, the present invention should not be so limited, and the present invention can, for example, be applied to a personal network which would be subject to the surge voltage.

While the invention has been particularly shown and described with respect to preferred embodiments thereof, it should be understood by those skilled in the art that the foregoing and other changes in form and detail may be made therein without departing from the spirit and scope of the invention as defined in the appended claims.

What is claimed:

1. A substrate connector assembly including a first circuit substrate, a second circuit substrate and a connector mounted on said first circuit substrate for connecting wiring patterns formed on said first circuit substrate with wiring patterns formed on said second circuit substrate;

wherein said circuit patterns formed on said first circuit substrate include first wiring patterns capable of being connected to external wirings and second wiring patterns positioned apart from said first wiring patterns by a predetermined creepage distance; and wherein said connector includes a contact array of a plurality of contacts, and a key which is formed at a position for separating said plurality of contacts of said contact array into a first contact group and a second contact group for (1) preventing a misconnection of said second circuit substrate and (2) separating said first wiring patterns from said second wiring patterns by said predetermined creepage distance, and wherein said first contact group is connected to said first wiring patterns and said second contact group is connected to said second wiring patterns.

2. A substrate connector assembly according to claim 1, wherein said first wiring patterns are capable of being connected to a public telephone line.

3. A computer system including a mother board, a connector mounted on said mother board and a circuit substrate connected to said connector;

wherein said mother board includes wiring patterns capable of being connected to external wiring and internal wiring patterns of said computer;

wherein said connector includes a contact array of a plurality of contacts, and a key which is formed at a position for separating said plurality of contacts of said contact array into a first contact group and a second contact group for (1) preventing a misconnection of said circuit substrate and (2) separating said first contact group from said second contact group by a predetermined creepage distance, wherein said first contact group is connected to said wiring patterns capable of being connected to said external wiring and said second contact group is connected to said internal wiring patterns; and wherein said circuit substrate includes a pad array of a plurality of pads, each of which is connected to each of said contacts of said contact array and a key notch capable of being engaged with said key of said connector, which is formed at a position for separating said plurality of pads of said pad array into a first pad group and a second pad group.

4. A computer system according to claim 3, wherein said circuit substrate is a modem card and said external wiring is a public telephone line.

\* \* \* \* \*